United States Patent [19]
Moresco et al.

[11] Patent Number: 6,034,332
[45] Date of Patent: Mar. 7, 2000

[54] POWER SUPPLY DISTRIBUTION STRUCTURE FOR INTEGRATED CIRCUIT CHIP MODULES

[75] Inventors: Larry Louis Moresco, San Carlos; Richard L. Wheeler, San Jose; Solomon I. Beilin, San Carlos; David A. Horine, Los Altos, all of Calif.

[73] Assignee: Fujitsu Limited, Japan

[21] Appl. No.: 09/038,805

[22] Filed: Mar. 11, 1998

Related U.S. Application Data

[62] Division of application No. 08/445,672, May 22, 1995, Pat. No. 5,765,279.

[51] Int. Cl.$^7$ ........................................................ H05K 1/03
[52] U.S. Cl. ......................... 174/255; 174/260; 174/261; 361/794; 257/623
[58] Field of Search .................................. 174/255, 256, 174/257, 261, 260; 361/792, 793, 794, 795, 780, 777, 774; 257/623, 624, 625, 699, 706, 707, 708, 618; 29/840

[56] References Cited

U.S. PATENT DOCUMENTS

| | | | |
|---|---|---|---|
| 4,002,542 | 1/1977 | Young | 204/38 A |
| 4,237,522 | 12/1980 | Thompson | 361/392 |
| 4,295,183 | 10/1981 | Miersch et al. | 361/403 |
| 4,467,450 | 8/1984 | Kuo | 365/149 |
| 4,673,904 | 6/1987 | Landis | 333/238 |
| 4,675,717 | 6/1987 | Herrero et al. | 357/71 |
| 4,714,952 | 12/1987 | Takekawa et al. | 357/75 |
| 4,811,082 | 3/1989 | Jacobs et al. | 357/80 |
| 4,827,323 | 5/1989 | Tigelaar et al. | 357/51 |
| 4,853,491 | 8/1989 | Butt | 174/52.4 |
| 4,889,962 | 12/1989 | Hagner | 174/68.5 |
| 5,079,069 | 1/1992 | Howard et al. | 428/209 |
| 5,134,539 | 7/1992 | Tuckerman et al. | 361/311 |
| 5,141,603 | 8/1992 | Dickey et al. | 205/124 |
| 5,177,594 | 1/1993 | Chance et al. | 257/678 |
| 5,376,818 | 12/1994 | Kurtz | 257/418 |
| 5,414,285 | 5/1995 | Nishihara | 257/301 |
| 5,714,241 | 2/1998 | Miyoshi | 428/210 |
| 5,780,143 | 7/1998 | Shimamoto et al. | 428/209 |
| 5,898,574 | 4/1999 | Tan et al. | 361/777 |

FOREIGN PATENT DOCUMENTS

| | | | |
|---|---|---|---|
| 0102596 | 4/1990 | Japan | 174/255 |
| 2026237 | 1/1980 | United Kingdom | 257/623 |

OTHER PUBLICATIONS

Early, "A Series of Demonstrators to Assess Technologies for Silicon Hybrid Multichip Modules," Proceedings of the 39$^{th}$ Electronics Components Conference, (ECC) 1989, pp. 557–561. "No Month".

Johnson, "Multichip Modules: Next–Generation Package, "*IEEE Spectrum*, Mar., 1990, pp. 34–36, 46, 48.

*Primary Examiner*—Kristine Kincaid
*Assistant Examiner*—Dhiru R Patel
*Attorney, Agent, or Firm*—Coudert Brothers

[57] ABSTRACT

A power distribution structure for a multichip module including, a base plate, a plurality of mesas arranged in a pattern are formed on the base plate, the mesas having electrically conductive upper surfaces which lie substantially in a single plane. A thin, conformal dielectric layer is formed over the exposed side surfaces of the mesas and the exposed surfaces of the support base and a conductive material is deposited over the dielectric material filling the area between and surrounding the mesas. The upper surfaces of the mesas and the upper surface of the conductive material surrounding the mesas lie in substantially one plane and are electrically isolated from each other by the dielectric material. A multilayered thin film structure for a multichip module may be formed over the power distribution structure and power and ground potentials supplied to microelectronic components, such as integrated circuit chips, mounted on the surface of the thin film structure using vias routed through the thin film structure.

13 Claims, 8 Drawing Sheets

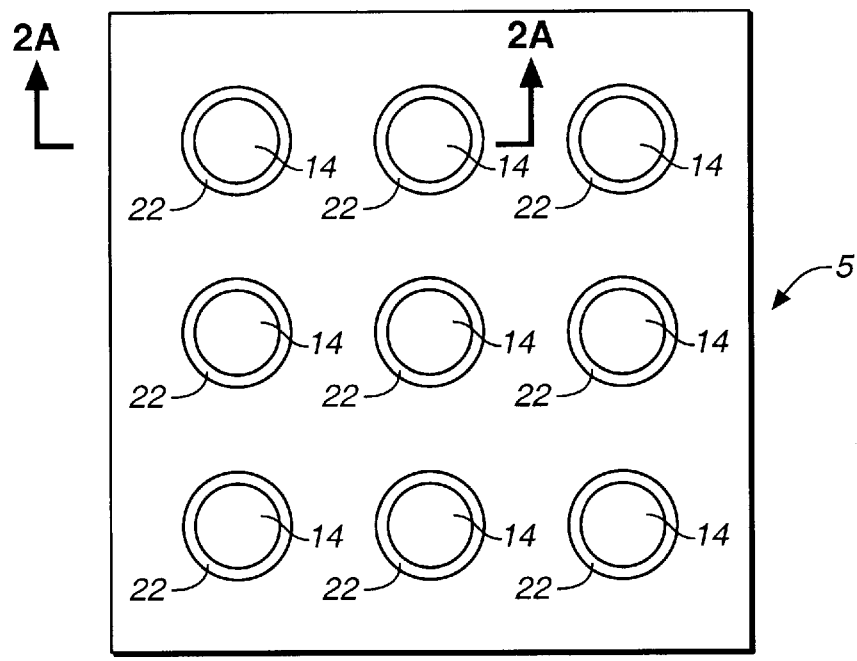
FIG._1A
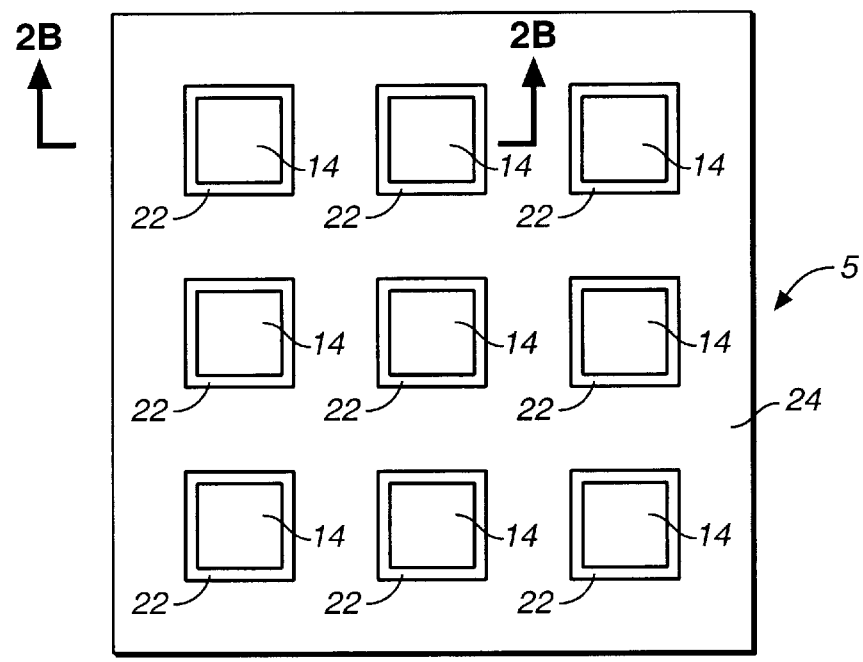
FIG._1B

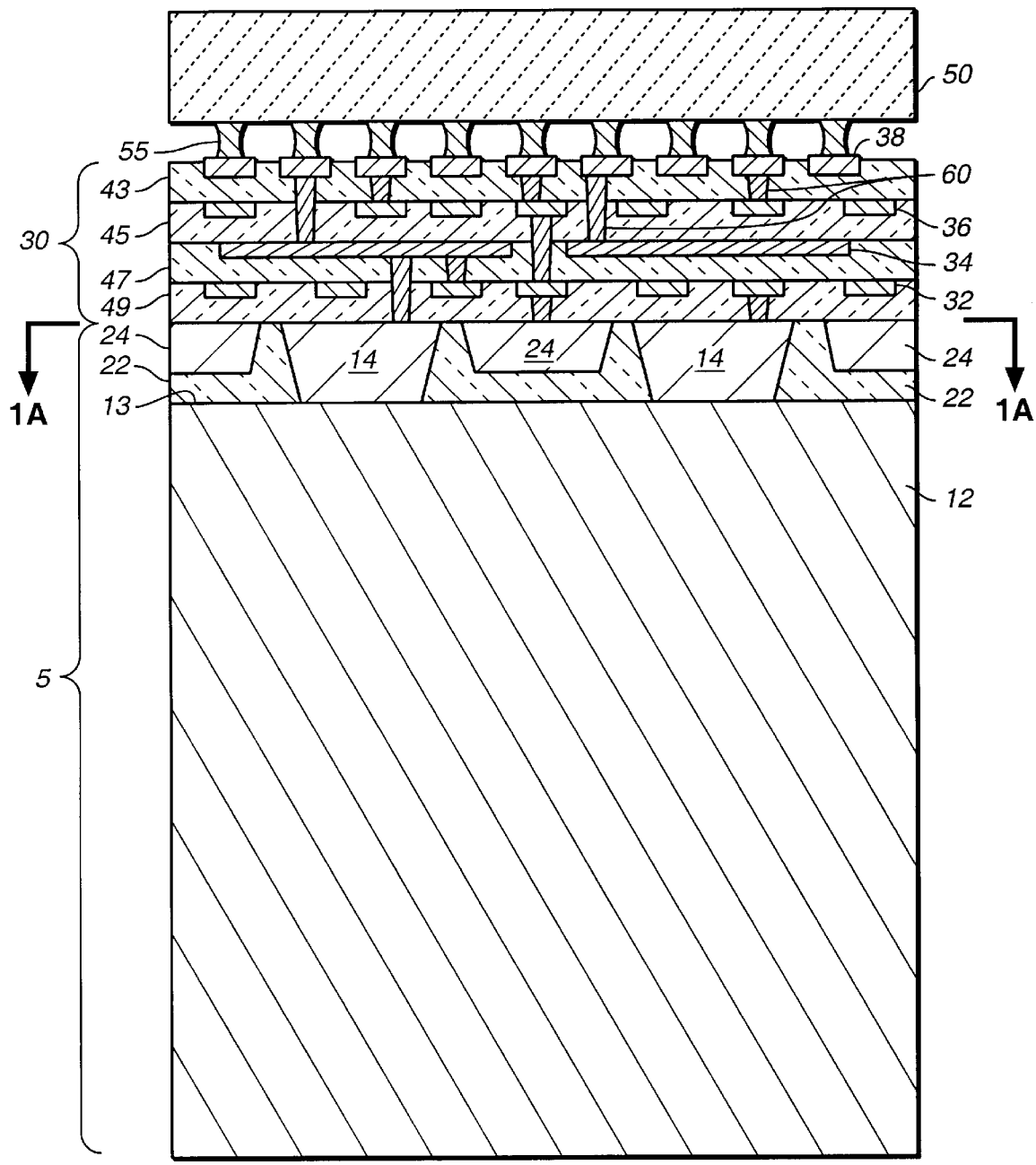
FIG._2A

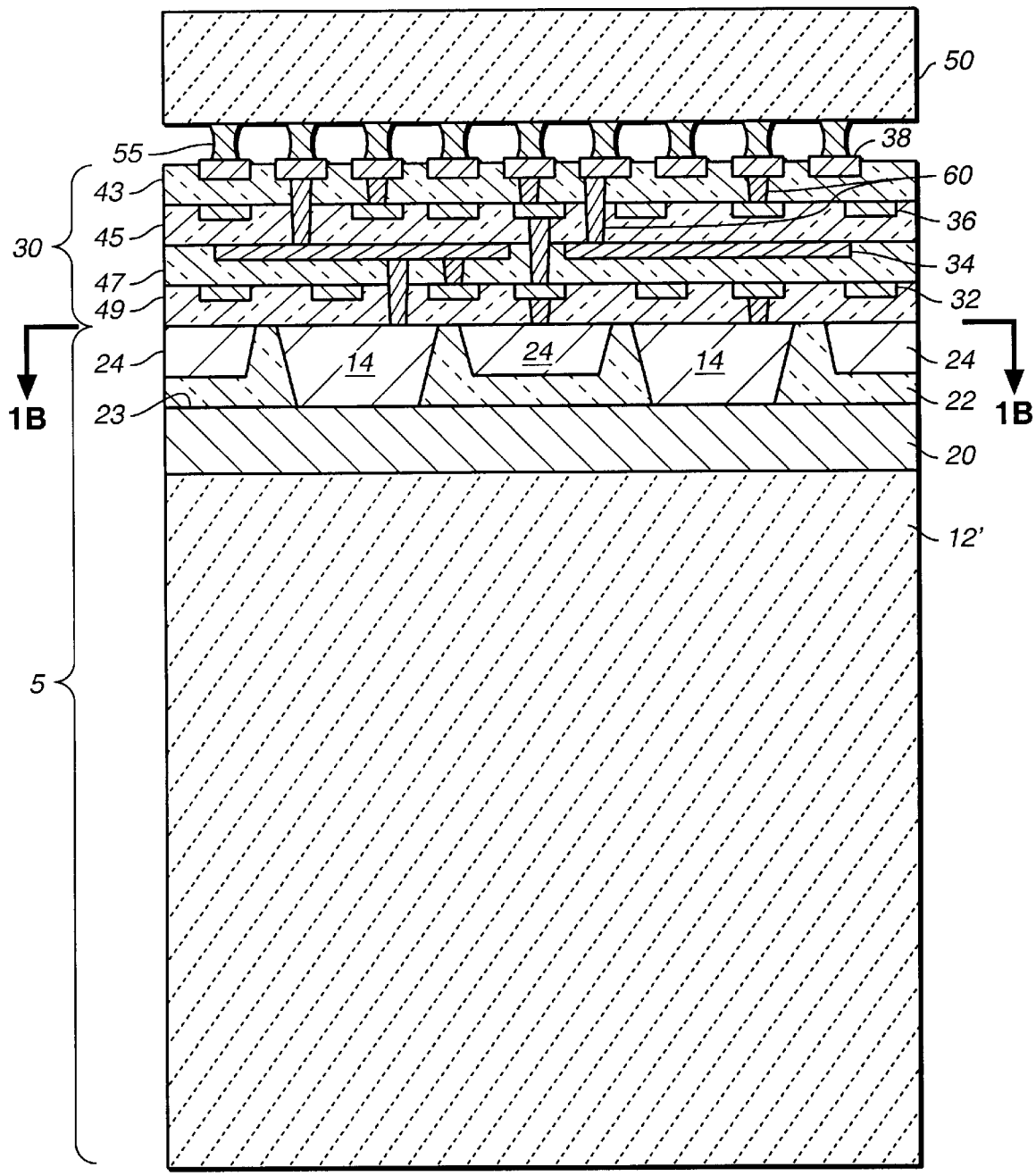
FIG._2B

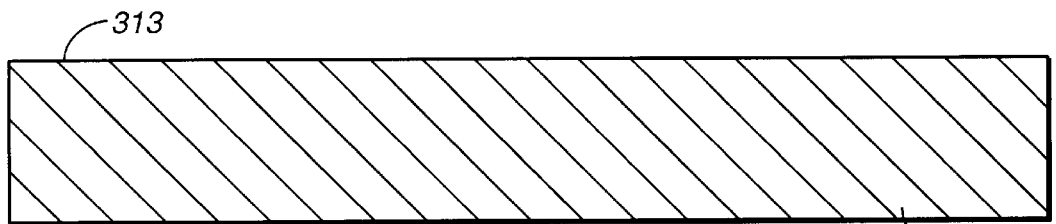
FIG._3A
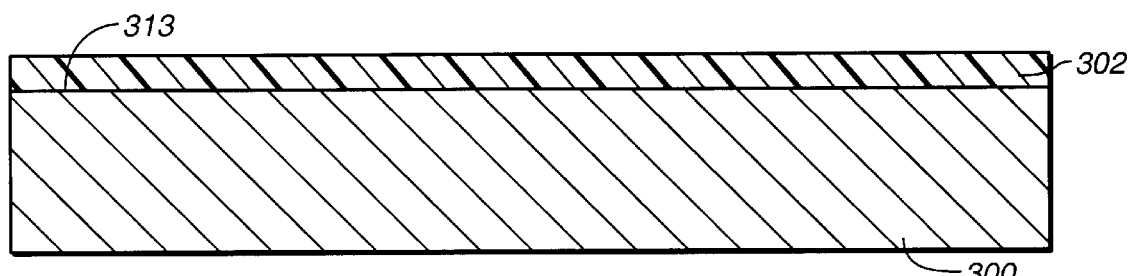
FIG._3B
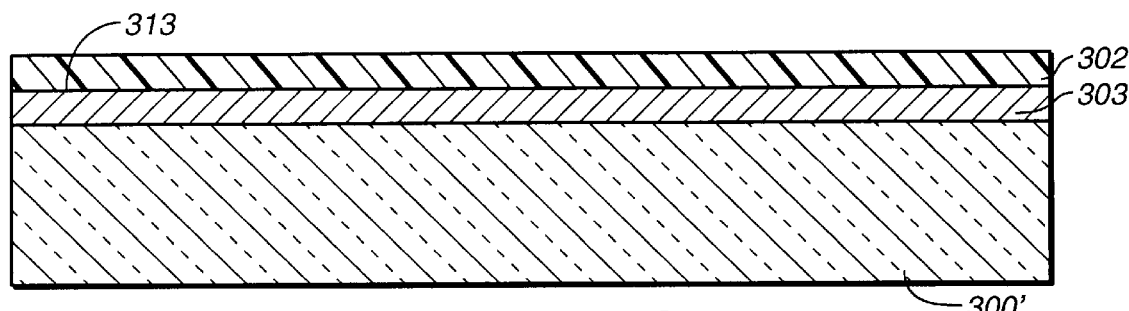
FIG._3C
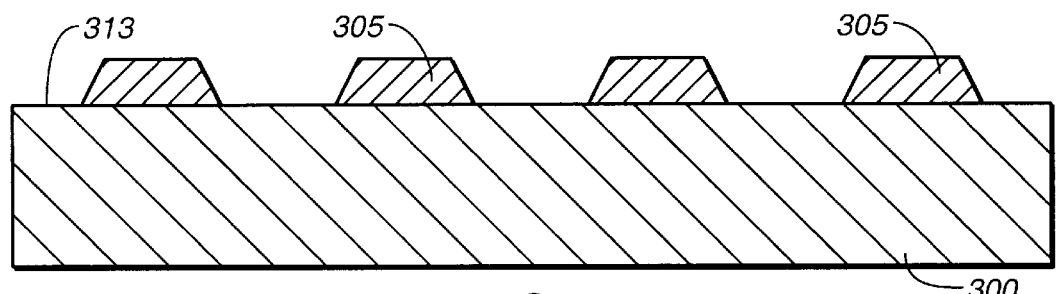
FIG._3D

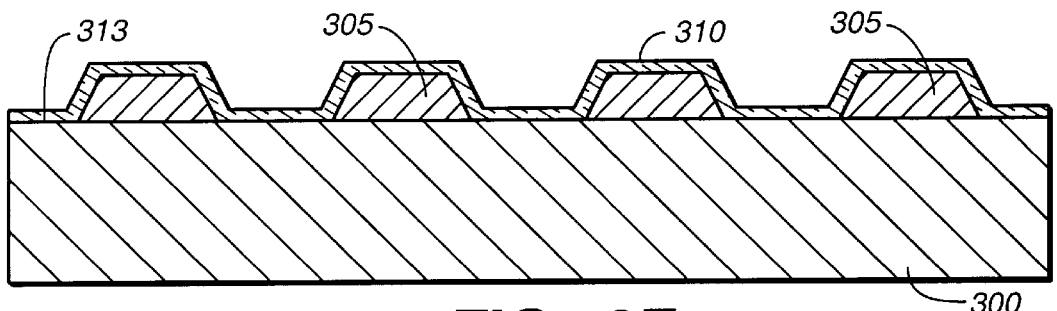
FIG._3E
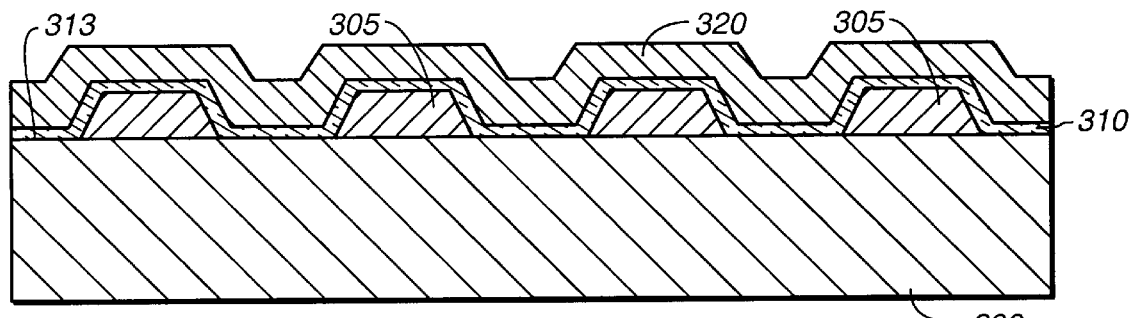
FIG._3F
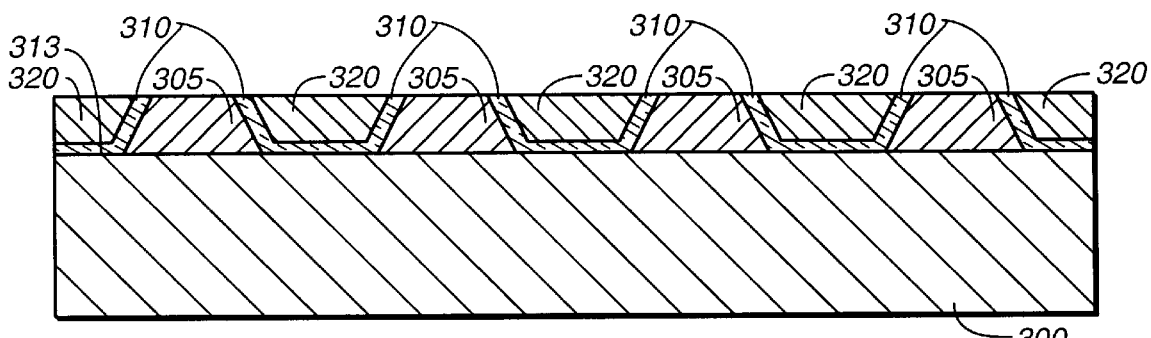
FIG._3G

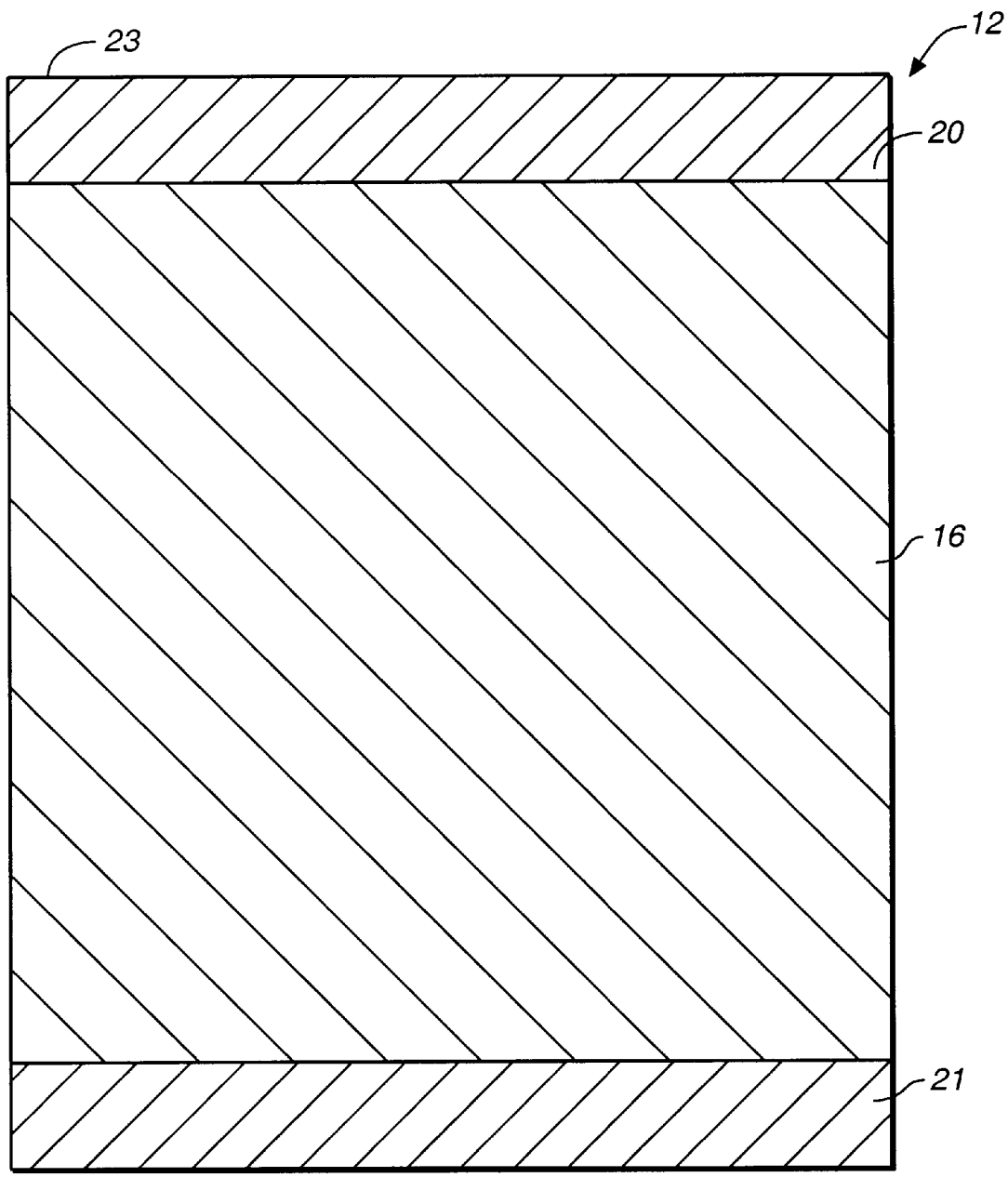
FIG._4

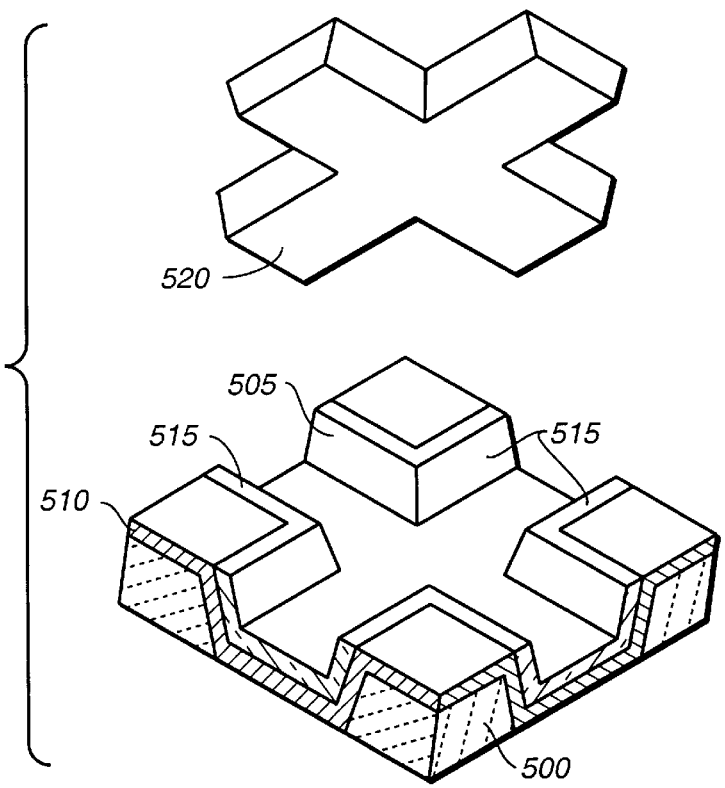
FIG._5
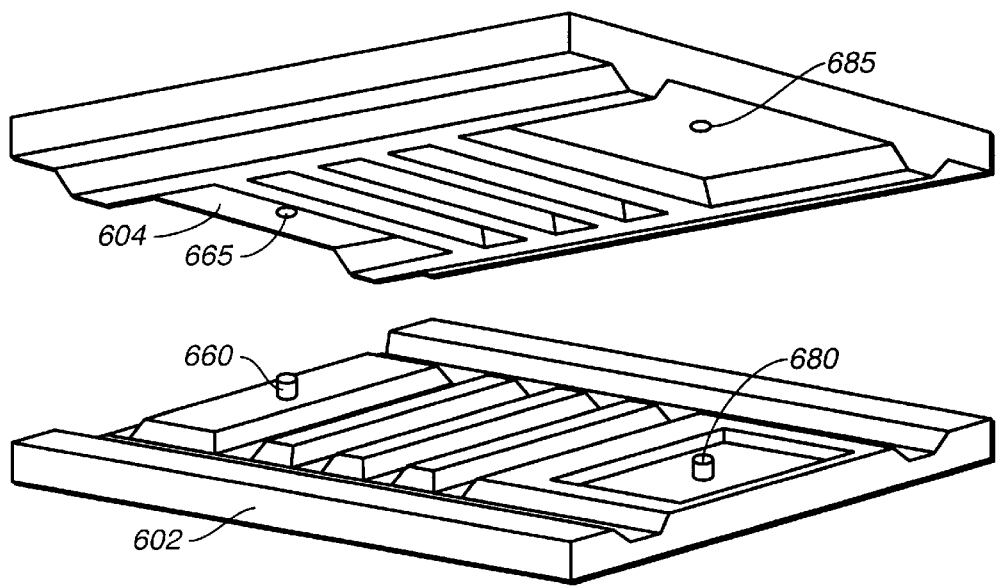
FIG._6

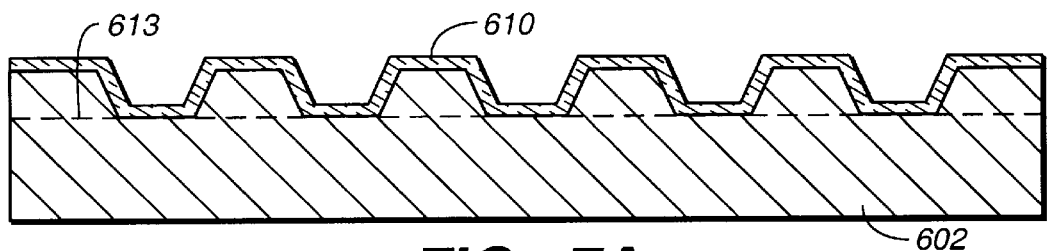
FIG._7A
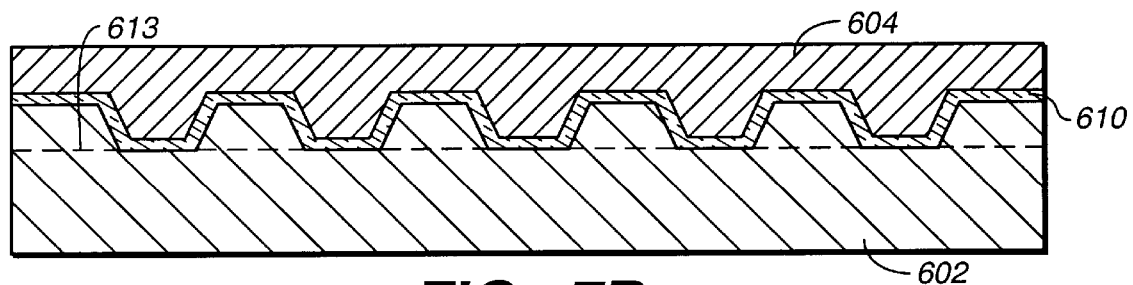
FIG._7B
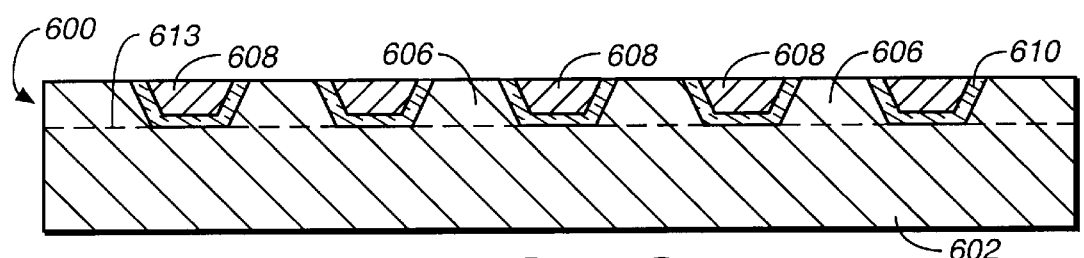
FIG._7C
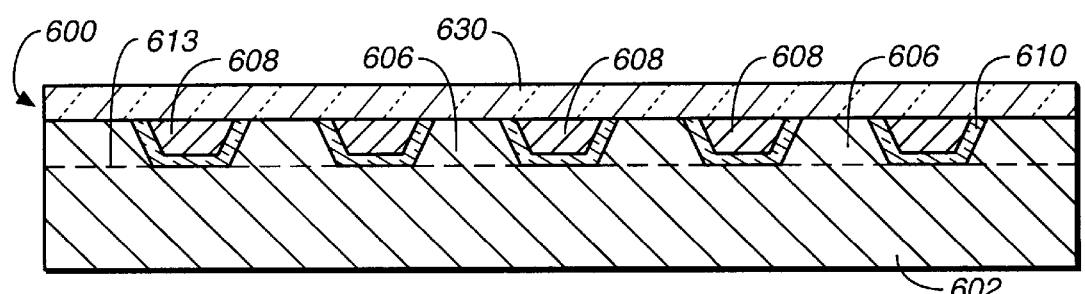
FIG._7D

POWER SUPPLY DISTRIBUTION STRUCTURE FOR INTEGRATED CIRCUIT CHIP MODULES

This is a divisional application of application Ser. No. 08/445,672, filed May 22, 1995 is now U.S. Pat. No. 5,765,279.

FIELD OF THE INVENTION

The present invention is related to integrated circuit chip packaging technology, and is particularly directed to structures for supplying power to integrated circuits mounted on single chip and multichip modules, and methods of fabricating such structures.

BACKGROUND OF THE INVENTION

Power distribution to microelectronic devices, such as integrated circuit chips is a major concern in many electronic applications. Of particular concern in the context of the present invention is power distribution to integrated circuits packaged in multichip modules.

In many electronic applications, particularly computer systems, a plurality of individual integrated circuit ("IC") chips are used to perform various system functions. The IC chips, which are quite small, must be "packaged" to provide signal, power and ground connections in a way that prevents damage to the highly sensitive chips. Typically, in low end applications, the IC chips are each individually packaged and then connected to a substrate, such as a computer motherboard. A multichip module ("MCM") is a form of packaging wherein a collection of IC chips are attached to one or more interconnected substrates. Multichip modules are used to improve overall system performance in several ways: the overall space needed to house the IC chips is significantly reduced, and by shortening the distance between chips within the module, high speed device operation is facilitated, e.g., power consumption, interconnect inductance and signal transmission delays are all reduced. MCMs may be designed to incorporate additional features such as an integral IC chip cooling system.

In an MCM a plurality of IC chips are typically connected to a multilayered substrate which contains the signal and power lines needed to supply power and to interconnect the chips to each other and to external devices. The substrate on which the IC chips are mounted will be referred to as the "MCM substrate." The connection between the MCM substrate and the IC chips may either be direct or through an intermediate or "interposer" substrate. In order to make the required number of interconnections, MCM substrates generally contain multiple patterned conductive layers separated by dielectric material. In addition, in order to provide bypass capacitance very close to the integrated circuit chips, capacitors are sometimes embedded within the MCM substrate, since the multilayered structure readily lends itself to capacitor formation, i.e., the capacitors are easily formed from opposing metal layers separated by dielectric. Generally, MCM substrates are either formed from ceramic layers, with metal paste used to form the signal and voltage lines and interlayer vias, or from thin film materials such as copper and polyimide. Hybrid MCM substrates, employing both types of technology are also known in the art. The present invention is particularly useful in connection with thin film MCM substrates, which are becoming more common due to the high density of interconnects they make possible.

Despite performance improvements, known multichip modules have several elements that limit system performance. One important problem with traditional multichip modules is the routing of low impedance power lines through the same layered thin film structure utilized to carry signals to and from the chip. Modem, high density MCM substrates usually comprise a multilayered thin film structure built up layer by layer on a relatively thick, rigid base substrate. A typical thin-film structure comprises interleaved layers of copper and polyimide. Due to technology used to make the thin film structure and the number of metal layers that are typically used, it is necessary to make the metal layers relatively thin. However, the thin metal layers have a relatively high impedance which results in undesired noise, voltage loss and excess thermal energy production, when the thin layers are used to supply power to the IC chips. Increasing the number of layers, which is one way of decreasing impedance without increasing the thickness of the layers, decreases module manufacturing yield.

Fabrication yield is a significant concern in the design and construction of complex multichip modules. In many designs, a failure in any individual component of the module will result in the entire module becoming useless. The fabrication yield of MCM substrates is directly related to the number of layers in the structure and is particularly related to the formation of any embedded bypass capacitors. The capacitors are particularly susceptible to breakdown due to small defects and the thinness of the dielectric layers used to separate capacitor plates.

Accordingly, it is a general object of the present invention to provide a structure for and a method of making a power distribution system for microelectronic components mounted on a chip substrate that improves over the prior art.

Another object of the present invention is to improve the routing of signal and power lines to microelectronic components mounted on a multilayered substrate.

Still another object of the present invention is to provide improved low impedance means for delivering power to microelectronic components mounted on a multilayered substrate.

Another object of the present invention is to provide a structure and method of fabricating a multilayered microelectronic device substrate that minimizes the internal stress of the resulting substrate assembly as it is thermally cycled.

A further object of the present invention is to provide reliable bypass capacitance positioned in close proximity to an integrated circuit chip mounted on a chip substrate.

Yet another object of the present invention is to provide a substrate structure that is highly modular, and a method for fabricating the same, so that individual components can be pretested prior to final fabrication of the substrate, and such that at least some of the components can be repaired.

SUMMARY OF THE INVENTION

The present invention provides a power distribution substrate for microelectronic components mounted on a substrate such as a multichip module, and a method for fabricating the same, which overcomes the aforementioned limitations of currently available substrate structures, and which provides additional advantages that will be apparent to those of ordinary skill in the art upon reading this specification in conjunction with the attached drawings and appended claims.

A method for fabricating a power distribution system for microelectronic devices mounted on a substrate, according to one embodiment of the present invention comprises the steps of providing a support base having a plurality of mesas formed thereon, the exposed surfaces of the mesas and of the support base being electrically conductive; forming a thin, conformal dielectric layer over the exposed surfaces of the mesas and of the support base; depositing a conductive material over the dielectric layer; and planarizing the resulting structure such that the upper surfaces of the mesas and the upper surface of the conductive layer lie in substantially one plane and are electrically isolated from each other by the dielectric material.

In the preferred embodiment, the substrate is either an MCM substrate or a high density single chip carrier, having a multilayered thin film structure formed over the planarized support base.

In another embodiment, the structure of the present invention is formed by providing a first support plate having a conductive surface with a plurality of recesses formed therein, coating the conductive surface of the support plate with a thin, conformal layer of dielectric material, providing a second plate having a conductive surface which mates with said first support plate, mounting said second plate on said first plate such that said second plate nests within said first plate to form a sandwich structure, and removing a portion of said sandwich structure such that a generally planar region is formed on the remaining surface thereof, said planar region having contiguous electrically isolated conductive areas separated by said dielectric layer.

A structure according to the present invention comprises a substrate for mounting microelectronic components, comprising a generally planar support base having an electrically conductive upper surface, a plurality of mesas positioned on said support base, the tops of said mesas being exposed, substantially coplanar, made of a conductive material and electrically coupled to the conductive upper surface of the support base; a dielectric layer covering the side walls of said mesas and the surface of said support base between and surrounding said mesas, the thickness of said dielectric layer being substantially less than the height of said mesas; and, a conductive layer positioned over said dielectric layer in the area between and surrounding said mesas, said conductive layer having a planar upper surface which is substantially coplanar with the tops of said mesas and which is electrically isolated from said mesas by said dielectric material.

BRIEF DESCRIPTION OF THE DRAWINGS

FIGS. 1A and 1B are plan views of two embodiments of a power distribution substrate in accordance with the present invention.

FIGS. 2A and 2B are cross-sectional views of two embodiments of a chip module incorporating the power distribution substrate of the present invention.

FIGS. 3A–3G are cross-sectional views of one embodiment of the power distribution substrate of the present invention at various stages of fabrication.

FIG. 4 is a cross-sectional view of a composite support base used in accordance with one embodiment of the present invention.

FIG. 5 is an exploded perspective view of one embodiment of a repeatable segment of the power distribution substrate of the present invention.

FIG. 6 is a perspective view of nesting plates used in the fabrication of another embodiment of the power distribution structure of the present invention.

FIGS. 7A–7D are cross-sectional views of another embodiment of a power distribution system of the present invention showing the structure at various stages of fabrication.

DETAILED DESCRIPTION OF THE INVENTION

The chip substrate of the preferred embodiment of the present invention is of the type which comprises a multilayered thin film structure which is formed upon a relatively thick, rigid support base. Thin film structures, such as copper/polyimide structures used in multichip modules, are too thin to be self supporting. Accordingly, such structures are formed on top of a rigid substrate or support base. In prior art structures, the support base is either entirely passive or contains one or more relatively thick power supply layers formed in parallel planes on the substrate, with power being routed from the conductive layers on or within the support base to the thin film structure by small diameter vias which extend to a surface of the support base. For purposes of the present disclosure the term support base should be understood to include not only the thick base substrate, but also any power supply layers that are formed thereon.

In contrast to the prior art, the support base of the present invention has a planar electrically conductive upper surface with a plurality of electrically isolated "islands" ranging over a substantial portion of the upper surface of the support base. In use, the islands are maintained at a different electrical potential than the remainder of the upper surface. Preferably, the islands are numerous and are arranged in a regular pattern such that at any location over the upper surface of the support base the distance to either ground potential or to a supply voltage is relatively short.

Referring now to the Figures in general and to FIGS. 1A and 1B in particular, there are shown plan views of two embodiments of the power distribution structure 5 of the present invention. Power distribution structure 5 is formed on top of a base plate 12 as shown in FIGS. 2A and 2B and described below in connection therewith. Generally, the surface of the power distribution structure comprises a plurality of conductive areas 14, which may be referred to as islands, surrounded by a conductive surface 24 and electrically isolated therefrom by a dielectric material 22. (As will be described below, conductive islands 14 are also referred to as "mesas" during intermediate stages in the fabrication of the power distribution structure of the present invention.) The upper surface of the power distribution structure 5, shown in FIGS. 1A and 1B, including both the upper surfaces of islands 14 and the upper surface of the surrounding conductive material 24, lies in one plane.

As described below, a multilayered thin film structure 30 (as shown in FIGS. 2A and 2B), may be formed on top of power distribution structure 5. As shown in FIGS. 1A and 1B, the conductive islands 14 are preferably numerous and arranged in a regular pattern, such as a grid pattern. When arranged in this manner, any location in the overlying thin film structure will be positioned close to a source of power or to a ground potential. This configuration enables the use of a relatively short conductive path between a ground or voltage potential of the power distribution structure and a microelectronic component, such as an IC chip, which is mounted on thin film structure 30.

The conductive islands 14 of the embodiment of FIG. 1A are generally circular, while those of the embodiment of the FIG. 1B are generally square or rectangular. Those skilled in the art will appreciate that other shapes such as more complex polygons, are possible for the islands and are considered to be within the scope of the present invention. Presently, the inventors prefer the use of circular islands, as depicted in FIG. 1A, with a diameter of approximately 30 $\mu$m and which are arranged in a rectangular grid having a pitch, i.e., a center-to-center distance between adjacent islands, of approximately 150–300 μm. Of course, the pitch may vary according to the application. One aspect of the present invention is that the density of islands on the surface of power distribution structure is high such that any location in or on the overlying thin film structure is close to a source of power or ground. This aspect is of the invention is best accomplished when the pitch is less than about 500 μm. While the diameter of the preferred embodiment of tops of the mesas of the present invention is preferably about 30 μm, the actual size will, again, be determined by the specific need. In some cases, the diameter can be reduced to about 20 μm or less while in others the diameters may be as great as 150 μm.

Turning to FIGS. 2A and 2B, cross-sectional views of two embodiments of multichip modules 10 incorporating the power distribution structure 5 of the present invention are shown. The embodiment of FIG. 2A is taken along view lines 2A—2A of FIG. 1A, while the embodiment of FIG. 2B is taken along view lines 2B—2B of FIG. 1B. (It is noted that while three mesas 14 are shown along the view lines of FIGS. 1A and 1B, for clarity, only two mesas are shown in FIGS. 2A and 2B, respectively.) For exemplary purposes, the embodiment of FIG. 2A utilizes a base plate 12 made of a conductive material, such as molybdenum, while the embodiment of FIG. 2B utilizes a base plate 12' made of a dielectric material, such as undoped silicon base plate 12 has an upper conductive surface 13, and base plate 12' has an upper conductive surface 23. Other choices of materials for the base plate are described below. Overall, base plate 12 should be thick enough to have sufficient rigidity for subsequent processing. In one embodiment, base plate 12 is approximately 650 μm thick. (For clarity, as will be appreciated by those skilled in the art, the Figures are not drawn to scale and omit certain well-known features not needed for an understanding of the present invention.)

Power distribution structure 5 is formed on the base plate 12 and, in the preferred embodiment, a multilayered thin film structure 30, is then formed on top of the power distribution structure. Thin film structure 30 preferably comprises a plurality of interleaved patterned copper and polyimide layers, as is known in the art. Microelectronic components, such as IC chips, are then mounted on the thin film structure. While one such IC chip 50 is shown in FIGS. 2A and 2B, in the preferred embodiment the final structure comprises an MCM for mounting a plurality of IC chips and or other microelectronic components.

While a molybdenum base plate is used in the preferred embodiment shown in FIG. 2A, other conductive or dielectric materials may be used for the base plate. It is generally preferred that base plate 12 have a coefficient of thermal expansion ("CTE") which closely matches the CTE of the thin film structure and the microelectronic components (e.g., IC chips) mounted thereon to minimize the stress that builds up as the assembly is thermally cycled. Other metals suitable for a low CTE base plate are tungsten and chromium. On the other hand, if circumstances permit, as where matching the CTE is not important, base plate 12 made be made of copper, which has the advantage of high conductivity.

In a more refined embodiment, base plate 12 may consist of a sandwich structure comprising, for example, a relatively thick molybdenum layer with thin copper layers formed on the upper and lower surfaces thereof. By choosing the proper thickness of the copper and molybdenum layers in such a structure, it is possible to make a composite substrate with a CTE which closely matches that of the IC chips. An exemplary support base of Cu/Mo/Cu composite, as shown in FIG. 4, comprises a thick molybdenum layer 16, having a low CTE (e.g., 5 ppm/° C.) between thin layers of copper 20, 21, a highly conductive metal having a very low bulk resistivity (e.g., 1.6–2.25 microohms cm). As noted, the ratio of the thicknesses of the individual layers within the composite structure is preferably chosen to provide a CTE that ideally matches that of the material comprising the ICs of the multichip module. In an exemplary composite support base, copper layers 20, 21 are 20–40 μm thick and layer 16 of molybdenum is 650 μm thick.

In the event that the base plate is a dielectric, or is a material which does not have sufficient conductivity, a conductive layer 20, as shown in FIG. 2B, is formed thereon prior to fabrication of the remainder of power distribution structure 5. Suitable dielectric materials for support base 12' include silicon, molybdenum nitride or aluminum nitride. Copper is preferred for conductive layer 20. Layer 20 should have a minimum thickness of approximately 20–30 μm. Other suitable metals for the high conductivity top layer 20 of the base plate include silver, gold and nickel.

Use of a conductive base plate, as shown in FIG. 2A, has the advantage of eliminating the need to deposit a conductive layer. On the other hand, use of a base plate made of a non-conductive material, such as silicon, as shown in FIG. 2B, offers the advantages of being easy to work with, (the processing technology associated with silicon is very highly developed), and potentially providing a better match with the CTE of the IC chips mounted on the MCM, which may also be made of silicon. While several examples of materials for use with the present invention have been described, those skilled in the art will appreciate that the list of examples is not exhaustive and that many other materials may be used.

Preferred materials for dielectric layer 22 are polyimide or various other organic dielectrics, tantalum pentoxide ($Ta_2O_5$), or adhesive glass. In the presently preferred embodiment, dielectric layer 22 has a thickness of approximately 10 μm. It has been determined that this is sufficiently thick to avoid shorting between conductive layers 14 and 24 due to pinholes or other defects, yet thin enough to create substantial bypass capacitance between the layers. Any other dielectric material that may be deposited in a sufficiently thin, defect-free layer and that has thermal stability up to approximately 400° C. in order to withstand the temperature cycles used during subsequent processing of the polyimide layers in the overlying thin film structure, may also be used. (If polyimide is not used in the thin film structure, or if a low temperature process is used to cure the polyimide, the temperature requirements for dielectric layer 22 may be reduced.) Alternatively, if the exposed surfaces of base plate 12 and mesas 14 are an anodizable metal, or are first coated with a thin film of an anodizable metal, such as tantalum, dielectric layer 22 may be formed thereon by anodization. Dielectric layer 22 should have good adhesive properties (e.g., adhesion strength measured by the 90° C. peel test greater than 40 g/mm or lap sheer greater than 1 kg/mm²), and have a CTE which closely matches the CTE of the material used for the base plate.

Conductive layer 24, overlying dielectric layer 22, fills the area surrounding mesas 24, and serves as the main power plane for the power distribution system of the present invention. The proper thickness of conductive layer 24 is determined by the DC voltage drop provided by the multichip module system design. In the presently preferred embodiment, conductive layer 24 is approximately 20–30 μm thick copper. As will be apparent to those skilled in the art, the required thickness of conductive layer 24, along with the permissible thickness of dielectric layer 22, will control the necessary height of the mesas.

In a more refined embodiment, the CTE of the material used for conductive layer 24 should closely match those of ground plane 14 so as to minimize the stresses. By properly choosing the materials of base plate 12, dielectric layer 22 and the conductive layer 24, the thermal strain and associated stress between the power distribution structure 5, the overlying thin film structure 30 and IC's 50 can be minimized.

Base plate 12 (and conductive layer 20, if applicable) having mesas or islands 14 thereon, all of which is separated by dielectric layer 22 from conductive layer 24, form the power distribution structure 5 of the present invention. This structure has an advantage over prior art modules in its reduced size, accomplished by use of the base plate as both a support base and a power bus. This structure also forms an integral decoupling capacitor inherently created by the large opposing surface area between the conductive layer 24 and base plate 12 (or conductive layer 20, if applicable). Those skilled in the art will readily appreciate the need to maintain adequate bypass capacitance in close proximity to high speed IC chips. The capacitance of the structure can be maximized by making dielectric layer 22 as thin as possible.

Optionally, additional layers may be added to the power distribution structure. For example, various materials may be used to promote adhesion between layers or to further help relieve thermal stresses. Chromium may be used, for example, as an adhesion layer between a silicon base plate and an overlying copper layer, or between a copper layer and a dielectric layer.

Although only one conductive layer 24 is shown in the Figures for distributing a supply voltage, as many voltage supply layers as desired can be formed in adjacent areas according to methods of fabricating the subject structure which are described below. Multiple voltage supplies allow the module to provide multiple voltages to the microelectronic components packaged on the module.

As described, a multilayered thin film structure 30 is formed on top of power distribution structure 5 to complete the multichip module substrate. In the preferred embodiment, this thin film structure 30 comprises interleaved patterned copper and polyimide layers which may be formed using techniques well known to those skilled in the art. The exemplary thin film structure 30 of FIGS. 2A and 2B depicts an embodiment that utilizes four patterned metal layers, 32, 34, 36 and 38 formed on top of four dielectric layers, 43, 45, 47 and 49, respectively. In an actual embodiment, a larger number of thin film layers are likely to be used. As is well known in the art, the patterned metal layers are used for signal lines and for power redistribution. (It will be noted, however, that the need for power distribution layers may be eliminated or greatly reduced due to the relatively direct, low impedance path between the power and ground planes of the present invention and the IC chip.) If desired, added bypass capacitance can also be incorporated into thin film structure 30. The uppermost patterned metal layer comprises a plurality of chip pads 38 on which microelectronic components such as IC chips can be mounted; (one such chip 50 is shown in FIGS. 2A and 2B). Preferably, the IC chips are mounted using high density techniques, such as solder bumps or wire interconnect structures 55. Vias 60 connect the chip pads 44 through the dielectric layers to the signal lines and power redistribution layers 32, 34, 36 and 38 and to the power and ground planes of power distribution structure 5.

Referring now to FIGS. 3A–3G, there is illustrated one embodiment of the present invention at various stages of fabrication. The process begins in FIG. 3A with the step of providing a base plate 300. Base plate 300 is preferably made of a conductive material such as molybdenum, but may also be made of a non-conductive material, such as undoped silicon, in which case a suitably thick conductive upper surface 303 such as copper (as shown in FIG. 3C) may first be formed thereon. Copper layer 303 may be formed using a number of known techniques. For example, a seed layer (not shown), such as chromium, may be sputtered onto base plate 300' and a thick copper layer plated thereon. An upper conductive surface 313 is provided by the upper surface of substrate 300 (FIG. 3A), and by the upper surface of layer 303 for substrate 300' (FIG. 3C). If a metal or metal-alloy combination base plate is desired, such as the Cu/Mo/Cu sandwich structure shown in FIG. 4, several known techniques can be used to create the base plate. For example, the top and bottom high conductivity layers can be deposited onto a preformed, relatively thick, low CTE middle layer by evaporation, sputtering, electrospraying, chemical vapor deposition ("CVD") lamination or electroplating.

As shown in FIGS. 3B–3D, a plurality of mesas 305 are formed on the surface of base plate 300. The mesas 305 can be formed either by an additive process or a subtractive process each of which is well known in the art. FIG. 3B shows a photoresist layer 302 applied to the surface of base plate 300, and FIG. 3C shows a photoresist layer 302 applied to the surface of conductive layer 303. The photoresist is exposed through an appropriately patterned mask (not shown) as is well known in the art. After exposure areas of the photoresist are removed by development thereby exposing the surface of base plate 300 (or conductive layer 303 as the case may be), and some areas of the photoresist remain undeveloped. In an exemplary additive process, conductive material is deposited, as by electroplating, into the areas from which the photoresist has been removed thereby forming mesas 305. In an exemplary subtractive process, the exposed surface of a base plate 300 (or conductive layer 303 as the case may be), is etched, as by wet-etching thereby forming mesas 305. As will be apparent to those skilled in the art, the mask used to expose the photoresist will be different depending on whether an additive or subtractive process is used to form mesas 305 and whether the photoresist in positive or negative. When using a dielectric base plate, as shown in FIG. 3C, it is preferred to use as additive process to form mesas on top of layer 303. On the other hand, when using a conductive base plate, as shown in FIG. 3B a subtractive process is preferred. Preferably, the mesas have a height of about 30 μm or more.

The vertical profile of the walls of the mesas will depend on the process which is used to form them. Although mesas are shown in the Figures as having a trapezoidal cross section, with the narrow end of the trapezoid on top, when a subtractive wet-etching process is used to form the mesas they may be wider at the top and narrower at the bottom due to undercutting.

In FIG. 3E a relatively thin dielectric layer 310, such as polyimide, has been formed in a continuous sheet over the exposed surfaces of base plate 300 and mesas 305 so as to conformally coat these surfaces. The thickness of the dielectric layer is preferably small (e.g., less than about 10 μm) in comparison to the height of the mesas (e.g., approximately 30 μm). As noted above, the dielectric layer may be formed by depositing one of the dielectric materials described above, or by anodization. After forming dielectric layer 310, a conductive material 320, such as copper, is deposited on top of dielectric layer 210 as shown in FIG. 3F. Conductive layer 320 should be deposited at a thickness which is at least the height of mesas 305. As shown in FIG. 3G, the surface of the resulting composite structure is then planarized, such as by mechanical polishing, lapping, chemical-mechanical polishing, milling, or etching to expose the tops of mesas 305, which are then electrically isolated by dielectric material 310 from the surrounding conductive layer 320. Mesas 305 can now be called islands and correspond to the islands 14 of FIGS. 1A and 1B.

Preferably, at this point in the fabrication process, testing is conducted to determine whether there are any shorts between base plate 300 (ground plane) and conductive layer 320 (power plane). Shorts may be caused by cracks or failures in dielectric layer 310. Applying a voltage between the two metal layers 300 (or 303 as the case may be) and 320 reveals the location of any dielectric shorts by means of the local heating caused by the current flowing in the tiny resistive shorts between the two planes.

After the power distribution structure is formed, a thin film structure (as shown in FIGS. 2A and 2B) is fabricated using known techniques. As described, the thin film structure may include additional bypass capacitors, power redistribution layers and signal carrying layers, with dielectric layers separating them, along with vias to connect the various layers to the chip pads and to the power distribution structure.

Referring now to FIG. 5, there is illustrated an exploded view of a repeatable segment of one embodiment of the power distribution system of the present invention depicting the use of a substrate having a grid of channels 505 forming a "waffle" pattern. In the embodiment of FIG. 5, channels 505 are formed in a nonconducting base plate 500, and a conductive layer 510 is then deposited over entire base plate 500 after the channels have been formed. Thus, is this embodiment, the mesas are not entirely made of conductive material but, rather, only have a conductive outer surface. Dielectric layer 515 is then formed over conductive layer 510 on the walls of channels 505. Channels 505 are then filled with conductive material 520.

In another alternative method of fabricating the present invention, conductive grid 520 can be separately fabricated and nested into channels 505. This method is, however, less preferred due to the fact that it is very difficult to separately form a conductive grid with very fine features. The view of FIG. 5 is helpful in illustrating the fact that the structure of the present invention provides a plurality of mesas or islands electrically isolated from and surrounded by a conductive grid, with the exposed surfaces of the islands and the grid being substantially contiguous and lying in the same plane. In the embodiment shown in FIG. 5, the mesas have generally square upper surfaces that are approximately 120 microns in length. The mesas could be round or have any other shape.

The waffle pattern of FIG. 5 also provides a base support which provides both ground and a supply voltage at a plurality of locations across the surface thereof This allows a relatively direct, short path between either the supply voltage plane or the ground plane and the overlying IC chip, or other microelectronic component, further helping to reduce the impedance. Thus, the path necessary to provide the supply voltage to a location on the surface of the MCM substrate need not require much routing in the lateral direction (i.e., parallel to the surface of the substrate) through the thin film substrate.

FIG. 6 illustrates another embodiment of the present invention. Use of the plates of FIG. 6 result in formation of a different grid configuration than the "waffle" grid depicted in FIG. 5. Power grid 600 (shown in FIG. 7C) is formed from two metal plates 602 and 604 that have been machined or cast into comb structures and which are designed to nest with one another. The alternative grid configuration resulting from the FIG. 6 plates is designed to provide power bars that are aligned with the direction of desirable current flow. Alignment of the plates may be provided by pins 660 and 680 on plate 602 which engage with holes 665 and 685, respectively, of plate 604. (After the substrate structure is configured, pins 660 and 680 can be machined away). A conformal dielectric layer is formed on one of the plates (shown in FIG. 6) to isolate the plates, one of which serves as the ground plate and the other as the power plate.

FIGS. 7A–7D show the steps for fabricating an embodiment of the present invention using the nesting plates shown in FIG. 6. In FIG. 7A, the channeled surface of metal plate 602 is conformally coated with a thin dielectric layer 610, preferably of adhesive glass or a high thermostability, high performance polyimide material. The upper conductive surface of plate 602 is shown by dashed line 613. In FIG. 7B, plate 604 is then positioned on top of plate 602 and dielectric layer 610. In FIG. 7C, plate 604 has been machined away to expose bars 606 of plate 602. After machining, bars 608 are all that remain of plate 604. In FIG. 7D, a thin film signal structure 630 has been fabricated on top of power supply structure 600, which serves as the base substrate for the thin film structure.

Although the invention has been described with reference to specific embodiments for multichip module application, this description is not meant to be construed in a limiting sense. Various modifications of the disclosed embodiment and other applications requiring low impedance power supply of the present invention will become apparent to persons skilled in the art upon reference to the description of the invention. For example, the basic structure and method of making that structure can also be used for single chip carriers, and with microelectronic components other than, or in addition to, IC chips. It is therefore contemplated that the appended claims will cover any such modifications, embodiments or applications that fall within the scope of the invention.

What is claimed is:

1. A substrate for mounting microelectronic components, comprising:

a generally planar support base having an electrically conductive upper surface, a plurality of mesas having respective tops and respective bottoms, said bottoms being positioned on said support base, the tops of said mesas being substantially coplanar with the upper surface of said planar support base, made of a conductive material and electrically coupled to said conductive upper surface of said support base;

a dielectric layer having a thickness and covering the side walls of said mesas and the conductive upper surface of said support base between and surrounding said mesas, the thickness of said dielectric layer being substantially less than the height of said mesas; and a conductive layer positioned over said dielectric layer between and surrounding said mesas, said conductive layer having a planar upper surface which is substantially coplanar with the tops of said mesas and being electrically isolated from said mesas by said dielectric material.

2. The substrate of claim 1 wherein said mesas are arranged in a pattern.

3. The substrate of claim 2 wherein said pattern is a grid pattern.

4. The substrate of claim 3 wherein the pitch is less than approximately 500 µm.

5. The substrate of claim 1 wherein the tops of said mesas are round and have a diameter in the range of 20–150 µm.

6. The substrate of claim 1 wherein the tops of said mesas are rectangular and have a side dimension which is between 20 and 150 µm.

7. The substrate of claim 6 wherein said rectangles are elongate.

8. The substrate of claim 7 wherein said elongate rectangles are parallel.

9. The substrate of claim 1 wherein said mesas have a height between their tops and bottoms which is approximately 30 µm.

10. The substrate of claim 1 wherein said dielectric layer has a thickness which is less than about one third of the height between the tops and bottoms of the mesas.

11. The substrate of claim 10 wherein said dielectric layer has a thickness of about 10 µm or less.

12. The substrate of claim 1 further comprising a thin film structure formed over the tops of said mesas and said conductive layer.

13. The substrate of claim 12 wherein at least one integrated circuit chip is mounted on said thin film structure and said support base has a coefficient of thermal expansion that is substantially the same as that of said at least one integrated circuit chip.

* * * * *

UNITED STATES PATENT AND TRADEMARK OFFICE
CERTIFICATE OF CORRECTION

PATENT NO.   : 6,034,332
DATED        : June 26, 2000
INVENTOR(S)  : Larry L. Moresco et al.

It is certified that error appears in the above-identified patent and that said Letters Patent is hereby corrected as shown below:

Column 2,
Line 4, delete "Modem" and substitute therefor -- Modern, --.

Column 5,
Line 7, delete "is".
Line 27, delete "silicon base" and substitute therefor -- silicon. Base" --.
Line 58, delete "made" and substitute therefor -- may --.

Column 8,
Line 45, delete "as" and substitute therefor -- an --.

Column 9,
Line 57, after "thereof" insert -- . --.

Column 10,
Line 52, after "support base," insert -- said mesas --.

Column 11,
Line 3, before "pitch" insert -- grid pattern has a" --.
Line 3, after "pitch" insert therefor -- which --.

Signed and Sealed this

Seventh Day of January, 2003

JAMES E. ROGAN
*Director of the United States Patent and Trademark Office*